United States Patent
Barnes et al.

(10) Patent No.: US 6,507,155 B1
(45) Date of Patent: Jan. 14, 2003

(54) INDUCTIVELY COUPLED PLASMA SOURCE WITH CONTROLLABLE POWER DEPOSITION

(75) Inventors: Michael Barnes, San Ramon, CA (US); John Holland, San Jose, CA (US); Valentin Todorov, Fremont, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/544,377

(22) Filed: Apr. 6, 2000

(51) Int. Cl.[7] .................................................. H01J 7/24
(52) U.S. Cl. .............................. 315/111.51; 315/111.21; 118/723 R
(58) Field of Search ....................... 315/111.21, 111.41, 315/111.51, 111.71; 118/723 R, 723 VE, 723 I

(56) References Cited

U.S. PATENT DOCUMENTS

| | | | |
|---|---|---|---|
| 4,629,940 A | * 12/1986 | Gagne et al. | 315/111.51 |
| 5,235,256 A | * 8/1993 | Nuckolls | 315/326 |
| 5,290,382 A | 3/1994 | Zarowin et al. | 156/345 |
| 5,401,350 A | 3/1995 | Patrick et al. | 156/345 |
| 5,556,501 A | 9/1996 | Collins et al. | 156/345 |
| 5,731,565 A | 3/1998 | Gates | 219/121.54 |
| 5,900,699 A | * 5/1999 | Samukawa et al. | 315/111.51 |
| 5,907,221 A | * 5/1999 | Sato et al. | 315/111.51 |
| 6,008,139 A | 12/1999 | Pan et al. | 438/730 |
| 6,016,131 A | 1/2000 | Sato et al. | 343/895 |
| 6,020,686 A | * 2/2000 | Ye et al. | 315/111.51 |
| 6,051,504 A | 4/2000 | Armacost et al. | 438/706 |
| 6,068,784 A | 5/2000 | Collins et al. | 216/68 |
| 6,077,384 A | 6/2000 | Collins et al. | 156/345 |
| 6,085,688 A | 7/2000 | Lymberopoulos | 118/723 I |
| 6,129,807 A | 10/2000 | Grimbergen et al. | 156/345 |
| 6,153,530 A | 11/2000 | Ye et al. | 438/720 |
| 6,159,860 A | 12/2000 | Yang et al. | 438/706 |
| 6,221,782 B1 | 4/2001 | Shan et al. | 438/710 |
| 6,247,425 B1 | 6/2001 | Lymberopoulos et al. | 118/723 I |
| 6,251,792 B1 | 6/2001 | Collins et al. | 438/710 |

FOREIGN PATENT DOCUMENTS

| | | | |
|---|---|---|---|
| EP | 0 742 577 | 11/1996 | H01J/37/32 |
| JP | 07 086238 | 3/1995 | H01L/21/3065 |
| WO | WO 00/36632 | 6/2000 | H01J/37/32 |

OTHER PUBLICATIONS

Yamada et al., "Mode for a Large Area Multi–Frequency Multiplanar Coil Inductively Coupled Plasma Source", Journal of Vacuum Science and Technology A, Sep./Oct. 1996, pp. 2859–2870.

PCT International Search Report from PCT/US 01/12178, Dated Jan. 25, 2002.

* cited by examiner

*Primary Examiner*—Don Wong
*Assistant Examiner*—Jimmy T. Vu
(74) *Attorney, Agent, or Firm*—Moser, Patterson, Sheridan; Joseph Bach

(57) ABSTRACT

Method and apparatus for distributing power from a single power source to a plurality of coils disposed on a processing chamber which provides controllable plasma uniformity across a substrate disposed in the processing chamber. The apparatus for distributing power from a power source to two or more coils disposed on a process chamber comprises a connection between the power source and a first coil, a series capacitor connected between the power source and the second coil, and a shunt capacitor connected to a node between the second coil and the power source. The method for distributing power from one power source to a plurality of coils comprises connecting a first coil between the power source and a ground connection, connecting a first power distribution network to the power source, wherein each power distribution network comprises a series capacitor and a shunt capacitor, and connecting a second coil between the first power distribution network and a ground connection.

61 Claims, 8 Drawing Sheets

INDUCTIVELY COUPLED PLASMA SOURCE WITH CONTROLLABLE POWER DEPOSITION

BACKGROUND OF THE INVENTION

1. Field of the Invention

The invention is generally related to controlling power distribution from a single power source to multiple components. More particularly, this invention is related to distribution of RF power to a plurality of radio frequency (RF) coils disposed on a RF plasma reactor.

2. Background of the Related Art

Plasma reactors are typically employed in performing various processes on semiconductor wafers, including etching processes and chemical vapor deposition processes. An inductively coupled RF plasma reactor typically has an inductive coil antenna wound around the reactor chamber and connected to a plasma source RF power supply. An inductively coupled RF plasma reactor can achieve a very high plasma ion density for high production throughput, while avoiding a concomitant increase in ion bombardment damage of the wafer.

Inductively coupled plasma reactors typically have a plasma ion density distribution that can vary greatly depending upon various processing parameters, including the particular process gas or gas mixture introduced into the reactor chamber. For example, the plasma ion density may be high at the wafer center and low at the wafer periphery for one process gas, while for another process gas it may be the opposite pattern (i.e., low at the wafer center and high at the wafer periphery). As a result, the RF coil designs are customized for each different process or process gas to provide commercially acceptable uniformity across a wafer surface in the reactor. A plurality of RF coils, typically two coils, are utilized to improve plasma uniformity in the processing chamber, and each RF coil is connected to a separate individual RF power source through separate RF match networks dedicated to control the amount of RF power delivered to the RF coil.

FIG. 1 is a cross sectional schematic view of a typical plasma processing chamber having two RF coils disposed on a lid of the chamber. The plasma processing chamber generally includes a vacuum chamber 10 having a generally cylindrical side wall 15 and a dome shaped ceiling 20. A gas inlet tube 25 supplies process gas (e.g., chlorine for etch processing) into the chamber 10. A substrate support member or wafer pedestal 30 supports a substrate, such as semiconductor wafer 35, inside the chamber 10. An RF power supply 40 is also typically connected to the pedestal 30 through a conventional RF impedance match network 45. A plasma is ignited and maintained within the chamber 10 by RF power inductively coupled from a coil antenna 50 consisting of a pair of independent (electrically separate) antenna loops or RF coils 52, 54 wound around different portions of the dome-shaped ceiling. In the embodiment shown in FIG. 1, both loops are wound around a common axis of symmetry coincident with the axis of symmetry of the dome-shaped ceiling 20 and the axis of symmetry of the wafer pedestal 30 and wafer 35. The first RF coil 52 is wound around a bottom portion of the dome-shaped ceiling 20 while the second RF coil 54 is positioned centrally over the ceiling 20. First and second RF coils 52, 54 are separately connected to respective first and second RF power sources 60, 65 through first and second RF impedance match networks 70, 75. RF power in each RF coil 52, 54 is separately controlled. The RF power signal applied to the first RF coil (bottom/outer antenna loop) 52 predominantly affects plasma ion density near the periphery of the wafer 35 while the RF power signal applied to the second RF coil (top/inner antenna loop) 54 predominantly affects plasma ion density near the center of the wafer 35. The RF power signals delivered to each of the RF coils are adjusted relative to each other to achieve substantial uniformity of plasma ion distribution over a substrate disposed on a substrate support member.

The addition of an independent RF power source and associated RF impedance match network for with each RF coil increases the equipment and operation costs for each additional RF coil utilized on a processing chamber, resulting in increased cost for processing wafers. Furthermore, the independent RF source and matching network configuration presents difficulties in matching the impedance of the coils, which leads to more difficulties in controlling the plasma power delivered to each of the coils.

Another attempt to control plasma power in an inductively coupled plasma reactor having multiple coils utilizes a plurality of high power relays for switching connection from the power source to each of the coils. However, the switching mechanisms do not provide efficient operation of the coils and do not provide sufficient control of the power delivered to each of the coils on a continual basis.

Therefore, there is a need for an apparatus for distributing power from a single power source to a plurality of coils disposed on a processing chamber which provides controllable plasma uniformity across a substrate disposed in the processing chamber.

SUMMARY OF THE INVENTION

The invention generally provides method and apparatus for distributing power from a single power source to a plurality of coils disposed on a processing chamber which provides controllable plasma uniformity across a substrate disposed in the processing chamber.

The apparatus for distributing power from a power source to two or more coils disposed on a process chamber comprises a connection between the power source and a first coil; a series capacitor connected between the power source and a second coil; and a shunt capacitor connected to a node between the second coil and the power source, the shunt capacitor being connectable to a ground connection.

The method for distributing power from one power source to a plurality of coils comprises connecting a first coil between the power source and a ground connection; connecting a power distribution network to the power source, wherein the power distribution network comprises a series capacitor and a shunt capacitor; and connecting a second coil between the power distribution network and a ground connection.

The invention also provides an apparatus for plasma processing comprising a chamber; a first coil and a second coil disposed on the chamber; a power source connected to the first coil; and a power distribution network connected between the second coil and the power source, the power distribution network comprising a series capacitor connected between the power source and the second coil; and a shunt capacitor connected to a node between the second coil and the power source, the shunt capacitor being connectable to a ground connection.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
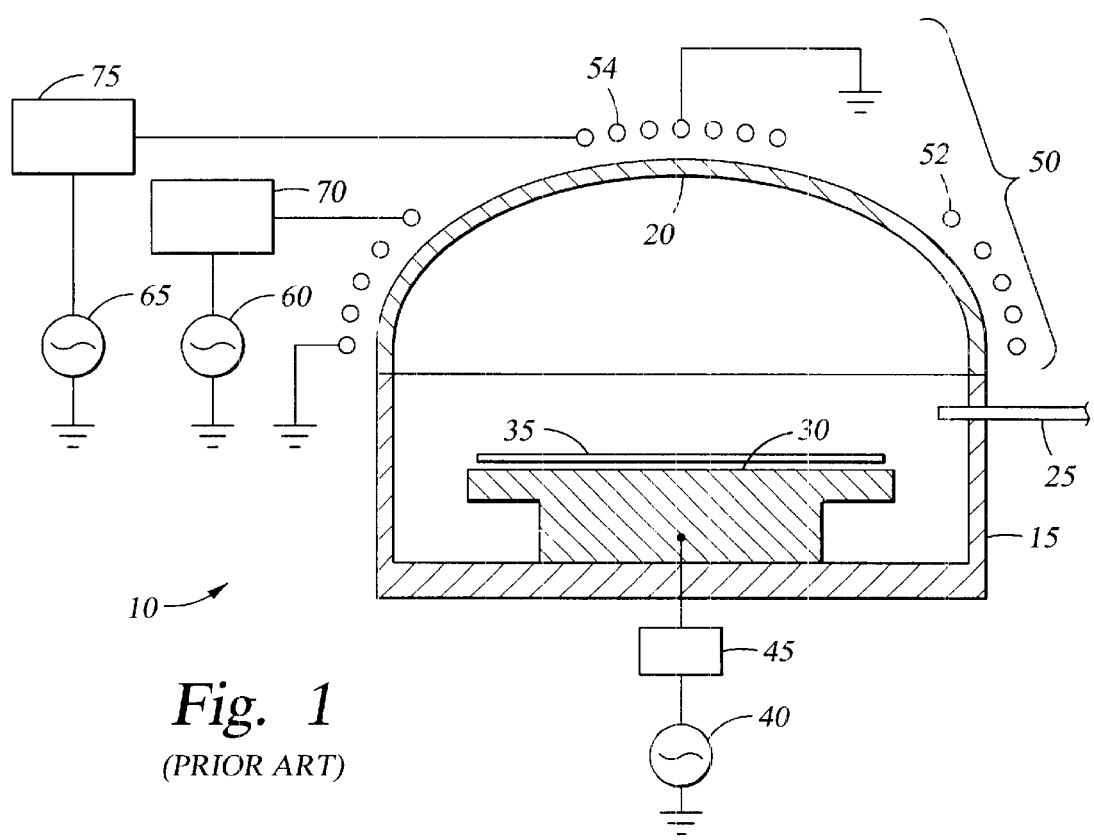
FIG. 1 is a cross sectional schematic view of a typical plasma processing chamber having two RF coils disposed on a lid of the chamber.
Figure 2:
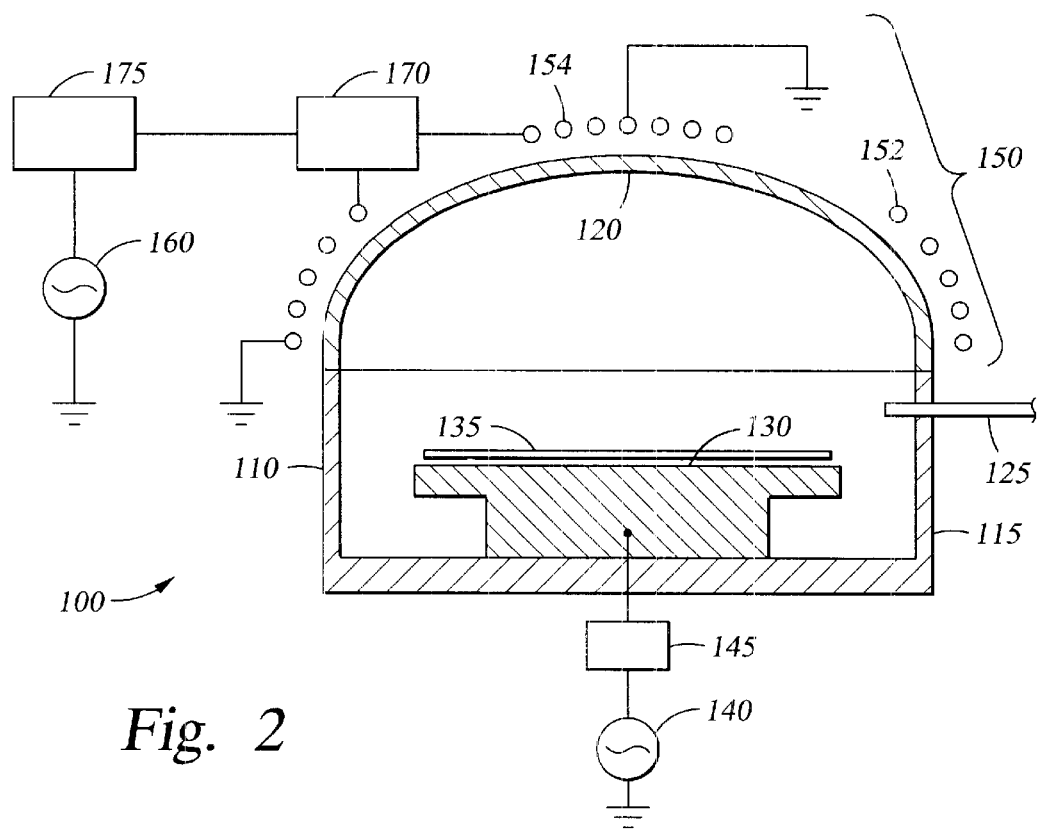
FIG. 2 is a cross sectional schematic view of a plasma processing chamber of the invention.

FIG. 2 is a cross sectional schematic view of a plasma processing chamber of the invention. The plasma processing chamber 100 generally includes a vacuum chamber 110 having a generally cylindrical side wall 115 and a dome-shaped lid 120. A gas inlet 125 supplies one or more process gases into the chamber 110. A substrate support member 130 supports a substrate, such as semiconductor wafer 135, inside the chamber 110. An RF power supply 140 may be connected to the substrate support member 130 through a conventional RF impedance match network 145. A plasma is ignited and maintained within the chamber 100 by RF power inductively coupled from a coil antenna 150 comprising a plurality of RF coils 152, 154 wound around different portions of the dome-shaped ceiling. In the embodiment shown in FIG. 2, two loops are wound around a common axis of symmetry coincident with the axis of symmetry of the dome-shaped lid 120 and the axis of symmetry of the substrate support member 130. The first RF coil 152 is wound around a bottom portion of the dome-shaped lid 120 while the second RF coil 54 is positioned centrally above the lid 20. The first and second RF coils 152, 154 are connected to a single RF power source 160 through an RF power distribution network 170 of the invention. Optionally, an RF impedance match network 175 may be connected between the RF power source 160 and the RF power distribution network 170.

RF power delivered to each RF coil 152, 154 is controlled by the RF power distribution network 170. The RF power signal applied to the first RF coil (i.e., bottom/outer antenna loop) 152 predominantly affects plasma ion density near the periphery of the wafer 135 while the RF power signal applied to the second RF coil (i.e., top/inner antenna loop) 154 predominantly affects plasma ion density near the center of the wafer 135. The RF power signals delivered to each of the RF coils are typically adjusted relative to each other to achieve substantially uniform plasma ion distribution over a substrate disposed on a substrate support member. The power distribution network can also be adjusted to produce a desired level of non-uniformity in the plasma to compensate for other factors during processing.

Figure 3A:
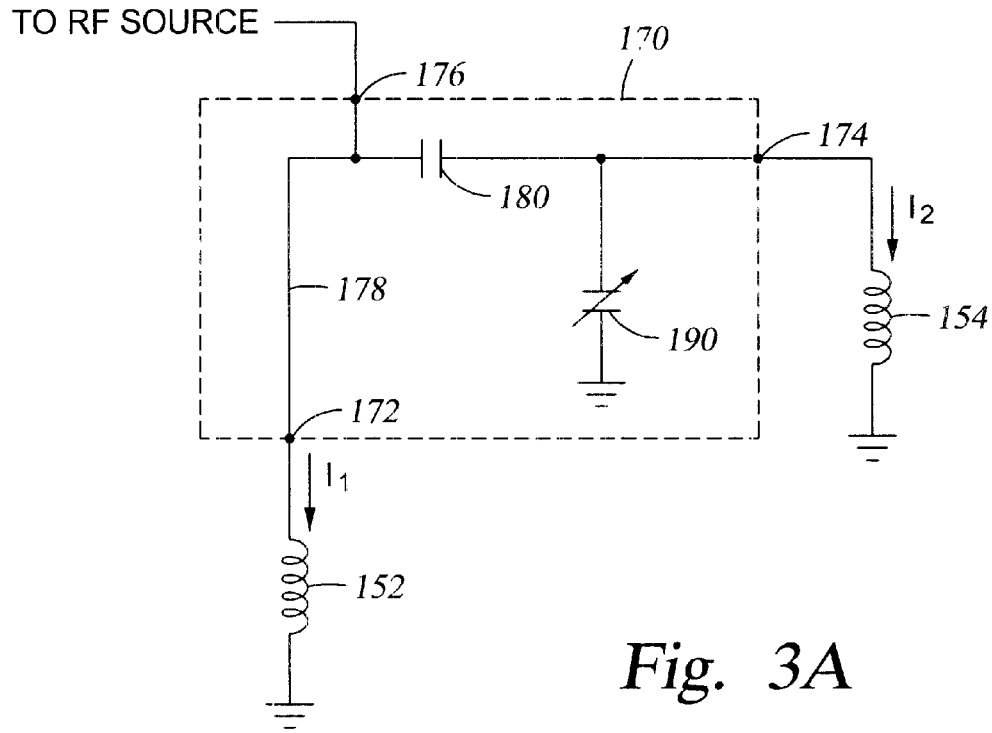
FIG. 3a is a schematic diagram of one embodiment of an RF power distribution network of the invention.

FIG. 3a is a schematic diagram of one embodiment of an RF power distribution network 170 of the invention. The RF power distribution network 170 includes an input 176 for connecting to the RF power source 160, a first output 172 for connecting to the first RF coil 152, and a second output 174 for connecting to the second RF coil 154. As shown in FIG. 3a, the RF power distribution network 170 includes a bypass line 178 connecting the input 176 to the first output 172, a series capacitor 180 connected between the input 176 and the second output 174, and a shunt capacitor 190 connected between the second output 174 and a ground connection. Both of the RF coils 152, 154 also include a ground connection. Effectively, in electrical terms, the shunt capacitor 190 is connected in parallel with the second RF coil 154, and the series capacitor 180 is connected in series with the parallel combination of the shunt capacitor 190 and the second RF coil 154. This series/parallel combination is connected in parallel with the first RF coil 152 to the RF power source, preferably through an RF impedance match network 175.

Figure 3B:
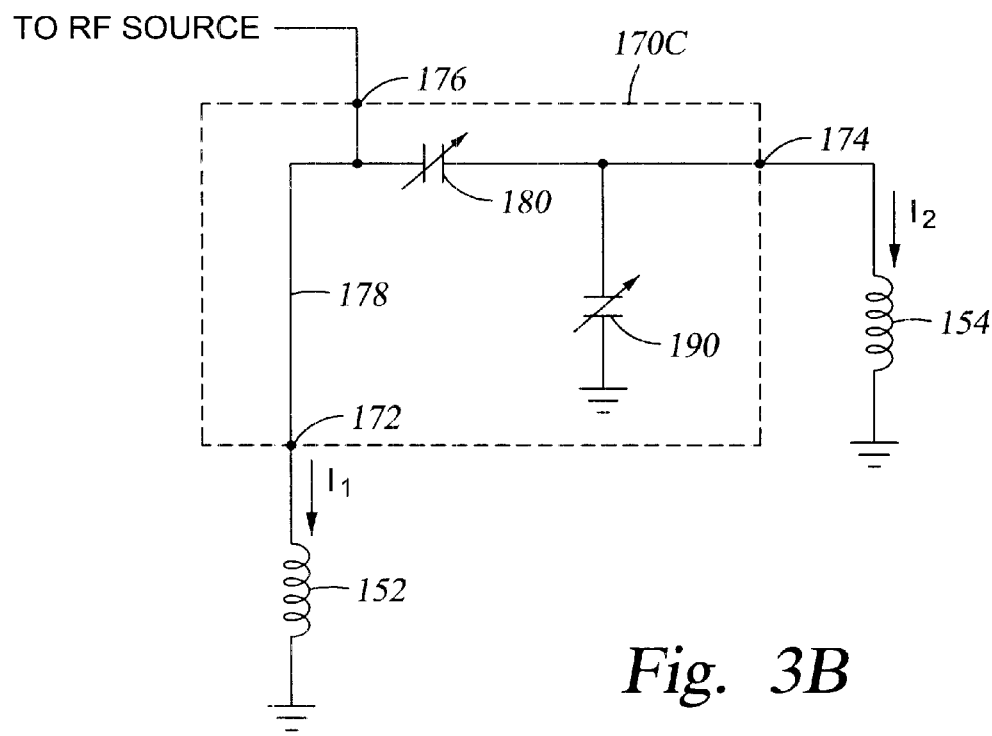
FIG. 3b is a schematic diagram of an alternative embodiment of the RF power distribution network.

The series capacitor 180 and the shunt capacitor 190 may comprise one or more variable capacitors which can be controlled by a controller for varying or changing the capacitance of the capacitor. Either or both of the capacitors 180, 190 can be variable capacitors. In one preferred embodiment, the series capacitor 180 comprises a capacitor having a fixed capacitance value while the shunt capacitor 190 comprises a variable capacitor. FIG. 3b is a schematic diagram of an alternative embodiment of the RF power distribution network 170c. The components shown in FIG. 3b are the same as those shown in FIG. 3a except for the series capacitor 180c, which is a variable capacitor. The RF power distribution network 170c as shown in FIG. 3b provides additional flexibility in control for the power distribution between the two coils because both series capacitance and shunt capacitance are adjustable.

Figure 4:
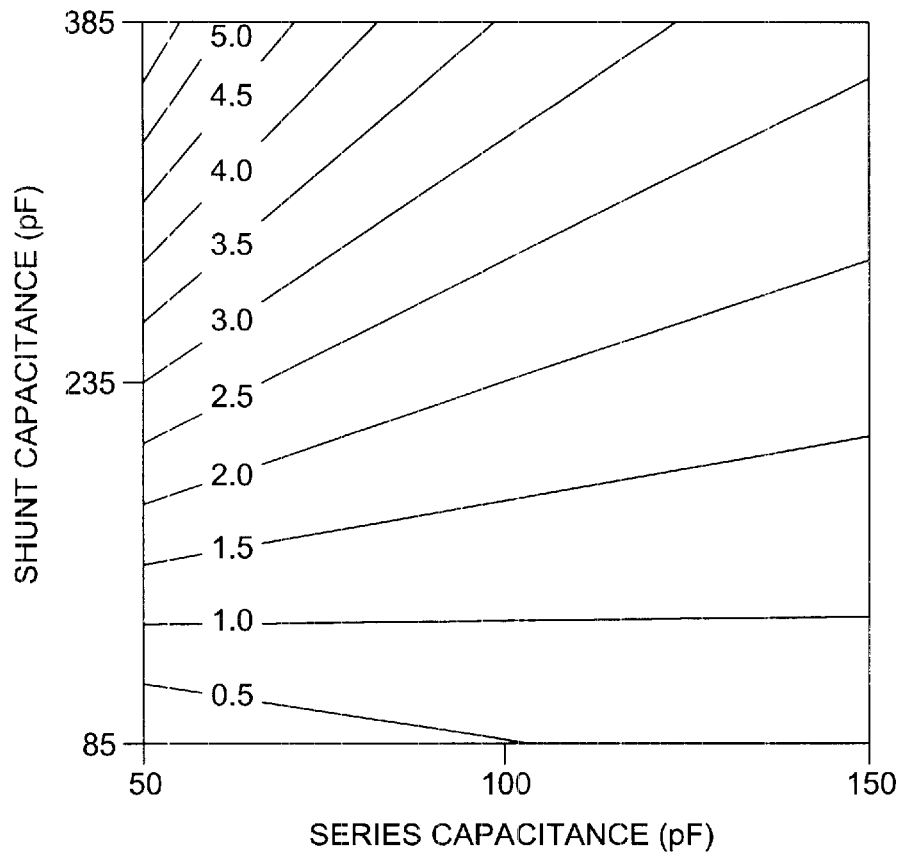
FIG. 4 is a graphical illustration showing the effects on the ratio of the electrical currents flowing through the two RF coils caused by varying the capacitance values of the series and shunt capacitors.

FIG. 4 is a graphical illustration showing the effects on the ratio of the electrical currents $I_1$ and $I_2$ flowing through the two RF coils caused by varying the capacitance values of the series and shunt capacitors. As shown, the current ratio, $I_1/I_2$, can be tuned to a desired value by adjusting the capacitance value of either the series capacitor or the shunt capacitor.

In one preferred embodiment, the shunt capacitor comprises a variable capacitor, and the power distribution between the two coils is controlled by adjusting the capacitance of the shunt capacitor 190. Typically, by varying the shunt capacitor, the ratio of $I_2:I_1$ can be adjusted from about 0.2 to about 5. Preferably, the capacitance of the shunt capacitor 190 can be varied to provide a ratio of $I_1:I_2$ between about 1:3 and about 3:1 to provide flexibility in shaping the plasma ion concentration in the chamber. For example, for the configuration shown in FIG. 3a, utilizing a RF power source operating at 13.56 MHz, a variable shunt capacitor 190 and a fixed series capacitor 180 of about 65 pF, the ratio of $I_1/I_2$ can be adjusted from about 0.4 to about 2.0 by the adjusting the shunt capacitor between about 100 pF and about 200 pF. As another example, in another configuration utilizing a variable series capacitor 180 and a fixed shunt capacitor 180 of about 115 pF, the ratio of $I_1/I_2$ can be adjusted from about 0.56 to about 0.85 by the adjusting the series capacitor between about 50 pF and about 150 pF.

Figure 10:
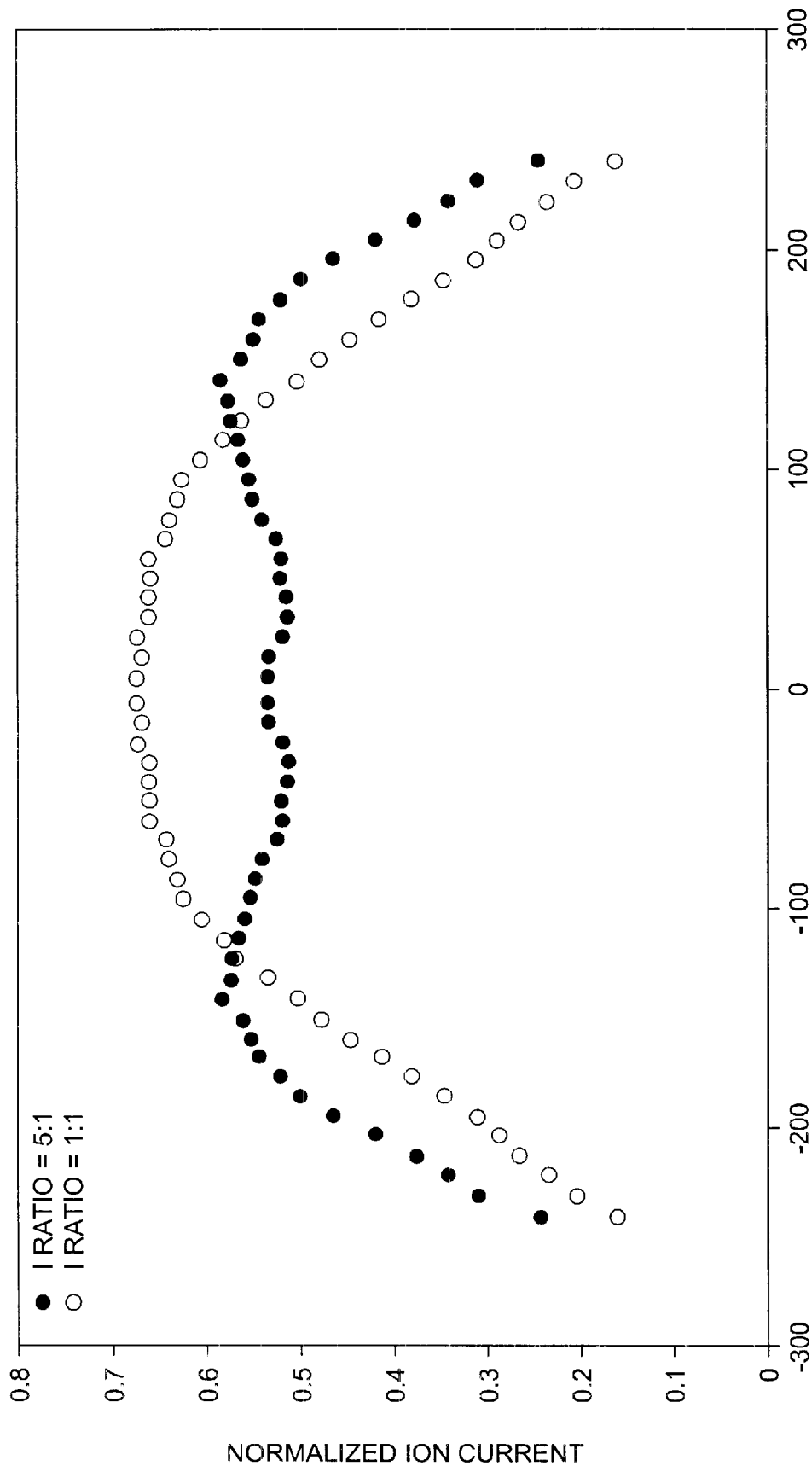
FIG. 10 is a graphical representation of ion density versus radial position in a plasma processing chamber having dual helical coils.

FIG. 10 is a graphical representation of ion density versus radial position in a plasma processing chamber having dual helical coils. As shown, a current ratio $I_1/I_2$ of about 1:1 provides substantially uniform plasma ion density (about ±3%) within about 100 mm radius from a central axis through the chamber. For a current ratio $I_1/I_2$ of about 5:1, the plasma ion density is substantially uniform (about ±4%) within about 180 mm radius. The invention provides control of the plasma ion density during processing, and the current ratio can be varied during different time periods of a process recipe to accommodate other processing parameters that may affect the plasma density during the process.

The power distribution network of the invention provides active control of the RF current flowing to each of the coils utilizing reactive elements such as capacitors. Generally, the power delivered to each coil includes a real component and a reactive component, and the invention varies the reactive component of the power delivered to each coil to change the distribution of power between the two coils. The real component of the power delivered to each coil remains substantially unaffected by the power distribution network. As further advantages, the power distribution network does not degrade the efficiency of transfer of power from the power source to the coils and does not significantly change the overall impedance of the entire circuit (i.e., including the coils). The efficiency of the power transfer is generally unaffected by the power distribution network of the invention because the network comprises only capacitive elements which have negligible resistive losses. A related advantage provided by the invention is that the impedance (or load) as seen by the power source is maintained at a desired value while the current ratio is varied by the power distribution network. The adjustments to the series capacitance and shunt capacitance of the power distribution network does not substantially change the load impedance to the power source.

A further advantage of the power distribution network of the invention is the ability to maintain a common phase angle for the RF currents in the multiple source coils, even as the current ratio is varied. The ability of control a common phase relationship in the RF currents is a major factor in achieving a controllable plasma uniformity because out-of-phase RF currents in adjacent source coils causes a net cancelling effect, thereby shifting the power deposition away from the plasma load. The invention provides control of the phase relationship between the currents in the coils while the current ratio is varied. Typically, the invention maintains a phase difference of less than about 10 degrees between the currents in the two coils.

Figure 5:
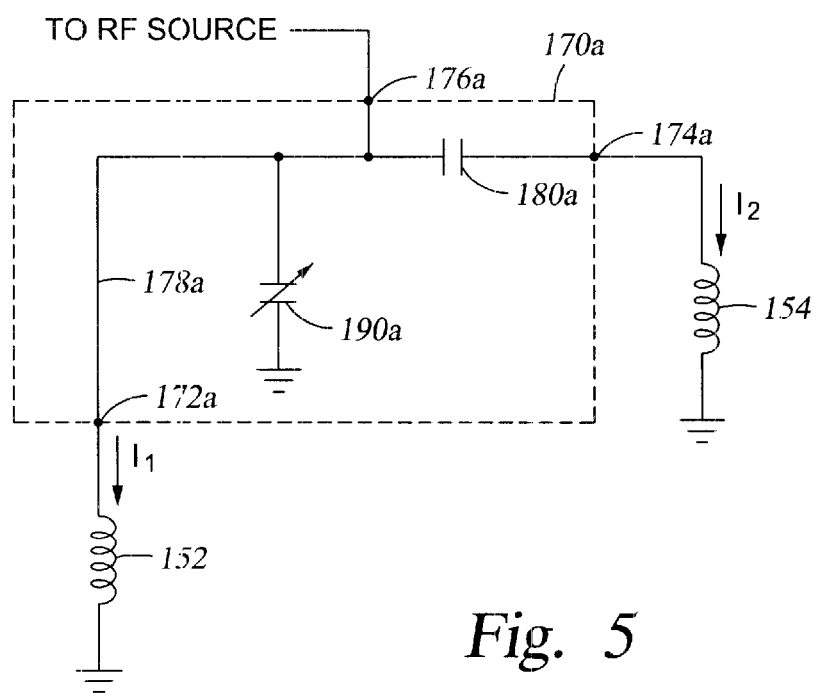
FIG. 5 is a schematic diagram of an alternative embodiment of an RF power distribution network of the invention.

FIG. 5 is a schematic diagram of an alternative embodiment of an RF power distribution network of the invention. The RF power distribution network 170a includes an input 176a for connecting to the RF power source 160, a first output 172a for connecting to the first RF coil 152, and a second output 174a for connecting to the second RF coil 154. As shown in FIG. 5, the RF power distribution network 170a includes a bypass line 178a connecting the input 176a to the first output 172a, a series capacitor 180a connected between the input 176a and the second output 174a, and a shunt capacitor 190a connected between the input 176a and a ground connection. Both of the RF coils 152, 154 also include a ground connection. Effectively, in electrical terms, the shunt capacitor 190a is connected in parallel with the first RF coil 152, and the series capacitor 180a is connected in series with the second RF coil 154. Preferably, an RF impedance match network 175 is connected between the input 176a and the RF power source 160. The alternative embodiment of the RF power distribution network also provides an adjustable current ratio, $I_1/I_2$, by adjusting the capacitance value of either the series capacitor or the shunt capacitor.

Figure 6:
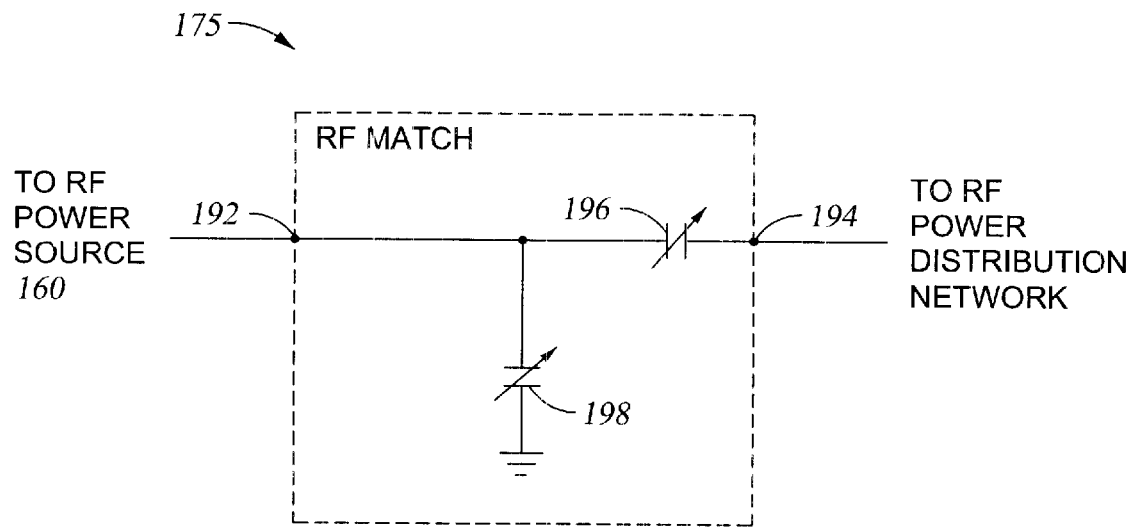
FIG. 6 is a schematic diagram of an RF impedance match network.

FIG. 6 is a schematic diagram of an RF impedance match network 175. The RF impedance match network 175 includes an input 192 connected to the RF power source 160 and an output 194 connected to the input 176 or 176a of the RF power distribution network 170 or 170a. The RF impedance match network 175 includes a series capacitor 196 connected between the input 192 and the output 194, and a shunt capacitor 198 connected between the input 194 and a ground connection. The series and shunt capacitors 196, 198 preferably are variable capacitors. Alternatively, either or both of the series and shunt capacitors 196, 198 may be variable capacitors. The RF impedance match network 175 can be adjusted to provide efficient or optimized power transfer from the RF power source 160 to the RF coils 170, 175.

Figure 7:
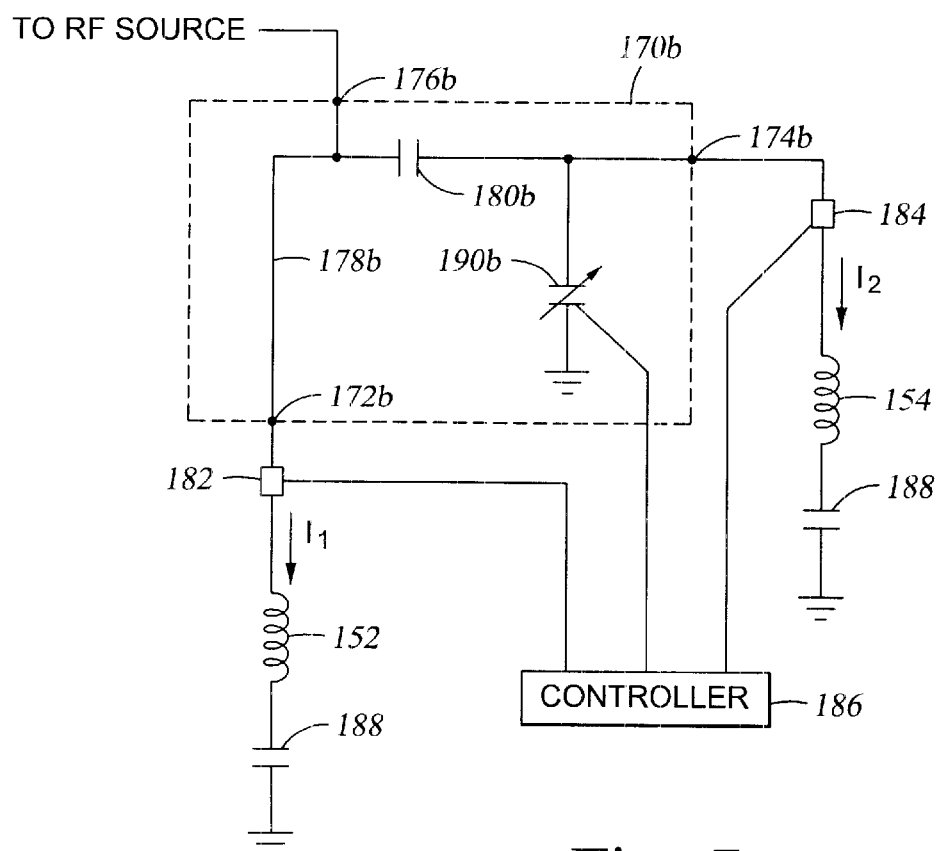
FIG. 7 is a schematic diagram of another embodiment of an RF power distribution network of the invention.

FIG. 7 is a schematic diagram of another embodiment of an RF power distribution network of the invention. The RF power distribution network 170b includes an input 176b for connecting to the RF power source 160, a first output 172b for connecting to the first RF coil 152, and a second output 174b for connecting to the second RF coil 154. The RF power distribution network 170b includes a bypass line 178b connecting the input 176b to the first output 172b, a series capacitor 180b connected between the input 176b and the second output 174b, and a shunt capacitor 190b connected between the second output 174b and a ground connection. Each of the RF coils 152, 154 is preferably connected to a ground connection through an optional grounding capacitor 188. For the embodiment shown in FIG. 7, the series capacitor 180b comprises a fixed capacitor, and the shunt capacitor 190b comprises a variable capacitor. A first current sensor 182 is disposed inline with the first RF coil 152, and a second current sensor 184 is disposed inline with the second RF coil 154. A controller 186, comprising a computer or microprocessor, is connected to the current sensors 182, 184 and the shunt capacitor 190b. The current sensors 182, 184 measure or sense the electrical current flowing to respective RF coils 152, 154 and provide the measured electrical current data to the controller 186. The controller 186 controls the capacitance of the shunt capacitor 190b in response to the data provided by the sensors 182, 184, and adjusts or changes the capacitance of the shunt capacitor 190b to maintain a desired current ratio $I_1/I_2$ which results in uniform plasma ion density.

Figure 8:
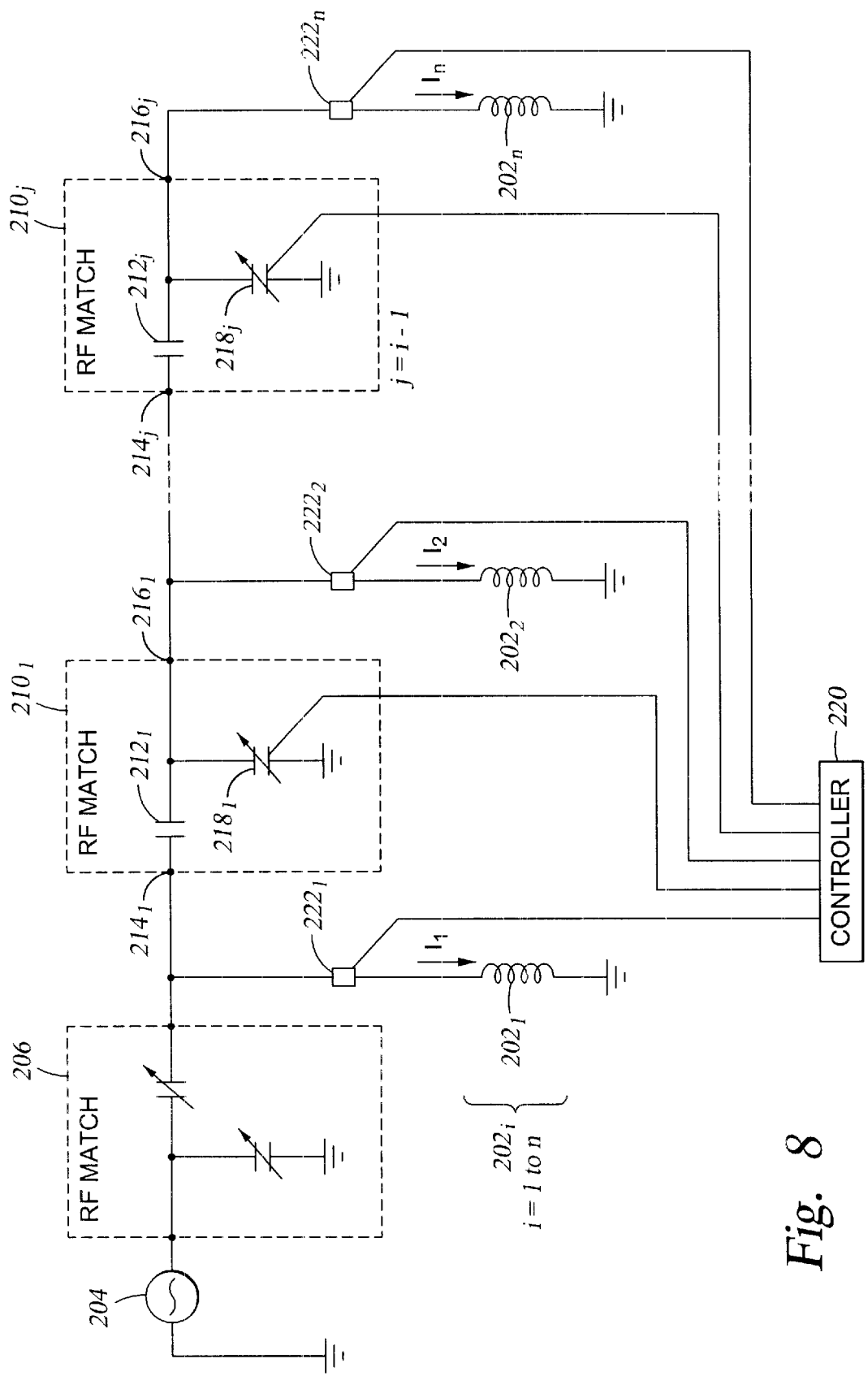
FIG. 8 is a schematic diagram of another embodiment of an RF power distribution network of the invention useful for a plasma processing chamber having multiple RF coils.

FIG. 8 is a schematic diagram of another embodiment of an RF power distribution network of the invention useful for a plasma processing chamber having multiple RF coils. As shown in FIG. 8, a plurality of RF coils $202_i$, where i=1 to n, are connected to a single RF power source 204, preferably through an RF impedance match network 206. Each RF coil $202_i$ includes a ground connection. A first RF coil $202_1$ is connected to the output of the RF impedance match network 206 without an RF power distribution network, but each subsequent RF coil $202_i$, where i=2 to n, includes an RF power distribution network $210_j$, where j=i−1. The second RF coil $202_2$ is connected to an RF power distribution network $210_1$, and this combination is connected in piggy-back fashion with the first RF coil. Similarly, each subsequent combination of RF coil $202_i$ and RF power distribution network $210_j$ is connected in piggy-back fashion with the previous RF coil $202_{i-1}$, resulting in one RF power distribution network connected between sequential branches of RF coils. Each RF power distribution network $210_j$ comprises a series capacitor $212_j$ connected between an input $214_j$ and an output $216_j$ of the RF power distribution network, and a shunt capacitor $218_j$ connected between the output $216_j$ and a ground connection. Alternatively, the shunt capacitor $218_j$ is connected between the input $214_j$ and a ground connection.

The series capacitor $212_j$ and the shunt capacitor $218_j$ may comprise one or more variable capacitors which can be controlled by a controller 220 for varying or changing the capacitance of the capacitor. Either or both of the capacitors $212_j$, $218_j$ can be variable capacitors. Preferably, the series capacitor $212_j$ comprises a capacitor having a fixed capacitance value while the shunt capacitor $218_j$ comprises a variable capacitor. Electrical current flowing through each RF coil can be tuned to a desired value by adjusting the capacitance value of the variable capacitor (i.e., either series or shunt capacitor) associated with the RF coil. Optionally, a plurality of sensors $222_i$ may be positioned inline with each RF coil to measure or sense the electrical current flowing through RF coils. The sensors $222_i$ are connected to provide electrical current data to the controller 220, which adjusts the capacitance of the variable capacitors in response data provided and maintains desired plasma ion uniformity in the chamber.

Figure 9A:
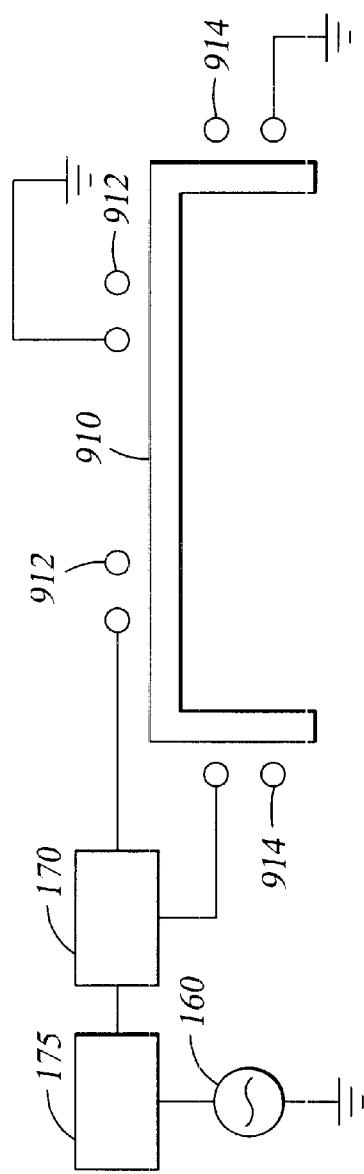
FIGS. 9a–9e are schematic cross sectional diagrams of various chamber designs utilizing multiple RF coils.
Figure 9B:
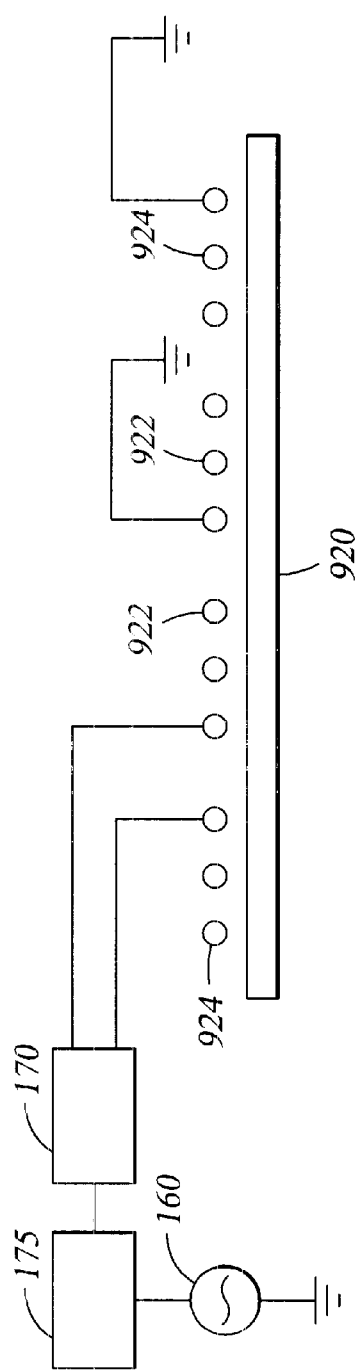
Figure 9C:
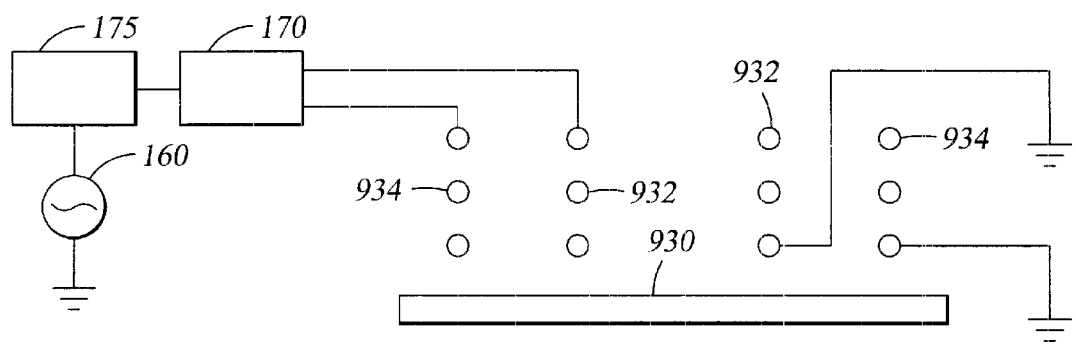
Figure 9D:
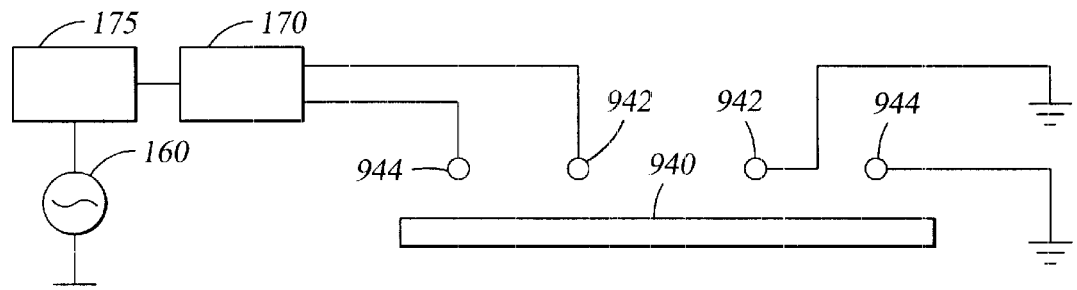
Figure 9E:
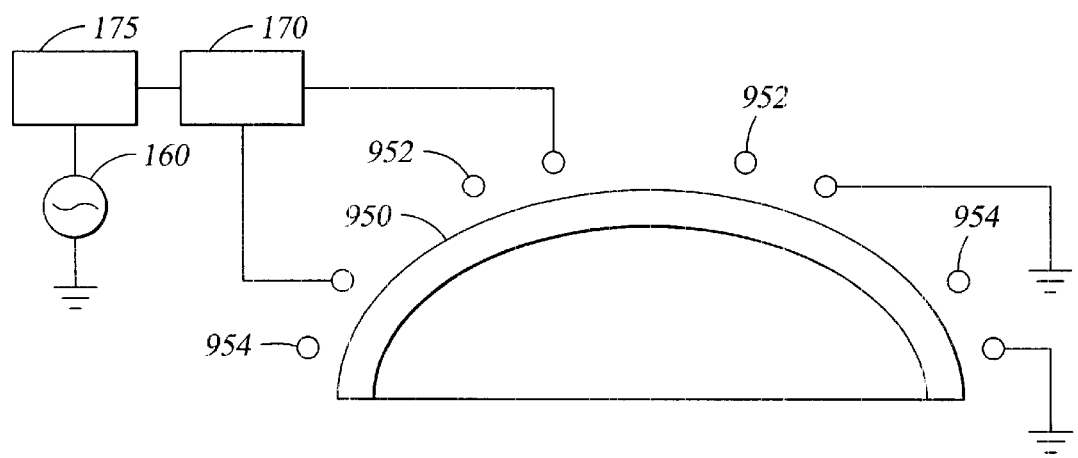

Although the invention is described using a process chamber having a domed-shaped lid with a side coil and a top coil, it is understood that the invention is applicable to other designs of process chambers having a plurality of RF coils or antenna loops for a variety of substrate processing, including etch, deposition and other plasma processes. FIGS. 9a–9e are schematic cross sectional diagrams of various chamber designs utilizing multiple RF coils connected to a power source 160 through a power distribution network 170 and an optional impedance match network 175. The chamber designs shown in FIGS. 9a–9e serve as examples of chambers contemplated by the present invention and do not limit application of the present invention to other chamber designs. FIG. 9a is a schematic cross sectional view of a high density plasma (HDP) processing chamber lid 910 having a planar top coil 912 and a helical side coil 914. FIG. 9b is a schematic cross sectional view of a chamber lid 920 having concentric planar inner coil 922 and outer coil 924. FIG. 9c is a schematic cross sectional view of an dual helical coil plasma source having an inner helix 932 and an outer helix 934 disposed concentrically on a planar processing chamber lid 930. FIG. 9d is a schematic cross sectional view of a dual coil plasma source having concentric planar single turn inner coil 942 and outer coil 944 disposed on a processing chamber lid 940. FIG. 9e is a schematic cross sectional view of a dual coil plasma source disposed on a domed-shaped processing chamber lid 950. The dual coil plasma source includes non-planar top/inner coil 952 and side/outer coil 954 which conform to the non-planar shape of the dome lid.

While the foregoing is directed to the preferred embodiment of the present invention, other and further embodiments of the invention may be devised without departing from the basic scope thereof, and the scope thereof is determined by the claims that follow.

What is claimed is:

1. An apparatus for plasma processing, comprising:
    a chamber;
    a first coil and a second coil disposed about the chamber;
    a power source connected to the first coil; and
    a power distribution network connected between the second coil and the power source, the power distribution network comprising:
        a series capacitor connected between the power source and the second coil; and
        a shunt capacitor connected to a node between the second coil and the power source.

2. The apparatus of claim 1, wherein the node is between the power source and the series capacitor.

3. The apparatus of claim 1, wherein the node is between the second coil and the series capacitor.

4. The apparatus of claim 1, wherein the series capacitor is a variable capacitor.

5. The apparatus of claim 1, wherein the shunt capacitor is a variable capacitor.

6. The apparatus of claim 1, wherein both the series capacitor and the shunt capacitor are variable capacitors.

7. The apparatus of claim 1, wherein the shunt capacitor and each coil is connectable to a ground connection.

8. The apparatus of claim 1, further comprising a match network connected between the power source and the first coil.

9. The apparatus of claim 8, wherein the match network is also connected between the power source and the power distribution network.

10. The apparatus of claim 9, wherein the match network comprises one or more variable capacitors.

11. The apparatus of claim 9, wherein the match network comprises a series capacitor.

12. The apparatus of claim 11, wherein the match network further comprises a shunt capacitor connected between the power source and a ground connection.

13. The apparatus of claim 1, further comprising:
    a third coil disposed on the chamber; and
    a second power distribution network connected between the first power distribution network and the third coil, the second power distribution network comprising:
        a second series capacitor connected between the first power distribution network and the third coil; and
        a second shunt capacitor connected to a node between the third coil and the first power distribution network.

14. The apparatus of claim 1, further comprising:
    at least one sensor disposed to measure power distribution between the coils.

15. The apparatus of claim 14, wherein the at least one sensor comprises at least one current sensor.

16. The apparatus of claim 15, further comprising:
    a controller connected to adjust one or more capacitors in the power distribution network in response to measured current data from the at least one sensor.

17. The apparatus of claim 1, further comprising a grounding capacitor connected between each coil and a ground connection.

18. An apparatus for distributing power from a power source to two or more coils, comprising:
    a connection between the power source and a first coil;
    a series capacitor connected between the power source and a second coil; and
    a shunt capacitor connected to a node between the second coil and the power source, the shunt capacitor being connectable to a ground connection.

19. The apparatus of claim 18, wherein the node is between the power source and the series capacitor.

20. The apparatus of claim 18, wherein the node is between the second coil and the series capacitor.

21. The apparatus of claim 18, wherein the shunt capacitor comprises a variable capacitor.

22. The apparatus of claim 21, wherein the series capacitor comprises a variable capacitor.

23. The apparatus of claim 18, further comprising:
one or more current sensors disposed to measure current flowing through one or more coils; and
a controller connected to receive measured current data from the one or more sensors, the controller connected adjust one or more capacitors.

24. The apparatus of claim 18, further comprising:
one or more grounding capacitors connected between each coil and a ground connection.

25. An apparatus for plasma processing, comprising:
a chamber;
a first coil and a second coil disposed on the chamber;
a power source; and
a power distribution network connected between the power source and the first and second coils, the power distribution network comprising at least one reactive element.

26. The apparatus of claim 25, wherein the power distribution network comprises:
a connection between the power source and the first coil;
a series reactive element connected between the power source and the second coil; and
a shunt reactive element connected to a node between the second coil and the power source.

27. The apparatus of claim 26, wherein the shunt reactive element comprises a variable capacitor.

28. The apparatus of claim 26, wherein the series reactive element comprises a variable capacitor.

29. A method for distributing power from one power source to a plurality of coils, comprising:
connecting a first coil between the power source and a ground connection;
connecting a power distribution network to the power source, wherein the power distribution network comprises a series capacitor and a shunt capacitor; and
connecting a second coil between the power distribution network and a ground connection.

30. The method of claim 29, further comprising:
connecting a subsequent power distribution network to a previous power distribution network; and
connecting a subsequent coil between the subsequent power distribution network and a ground connection.

31. The method of claim 29, wherein the shunt capacitor comprises a variable capacitor and the method further comprises controlling a capacitance of the shunt capacitor.

32. The method of claim 31, further comprising:
measuring electrical current flowing through one or more coils; and
controlling a capacitance of the shunt capacitor to maintain desired electrical current flow through one or more coils.

33. The method of claim 31, further comprising:
measuring electrical current flowing through one or more coils; and
controlling a capacitance of the shunt capacitor to vary electrical current flow through one or more coils during processing.

34. The method of claim 29, further comprising:
connecting the first coil and the first power distribution network to the power source through a match network.

35. The method of claim 29, wherein the series capacitor is connected in series with the second coil and the shunt capacitor is connected in parallel to the subsequent coil.

36. The method of claim 29, wherein both the series capacitor and the shunt capacitor are variable capacitors, and the method further comprises:
varying both series capacitance and shunt capacitance to maintain desired current ratio between the coils.

37. The method of claim 36, further comprising:
varying series and shunt capacitances to maintain desired current ratio between the coils and desired impedance at the connection to the power source.

38. The method of claim 36, further comprising:
varying series and shunt capacitances to maintain desired current ratio between the coils and desired phase relationship between the currents flowing in the coils.

39. The method of claim 36, further comprising:
varying series and shunt capacitances to maintain desired current ratio between the coils and desired phase relationship between the currents flowing in the coils.

40. The method of claim 36, further comprising:
varying series and shunt capacitances to vary current ratio between the coils while maintaining desired phase relationship between the currents flowing in the coils.

41. The method of claim 36, further comprising:
varying series and shunt capacitances to vary current ratio between the coils while maintaining phase relationship between the currents flowing in the coils within about 10 degrees.

42. An apparatus for plasma processing, comprising:
a chamber having a domed-shaped lid;
a first coil and a second coil disposed about the dome-shaped lid of the chamber, wherein the first coil is an outer side coil and the second coil is an inner top coil;
a power source connected to the first coil; and
a power distribution network connected between the second coil and the power source, the power distribution network comprising:
a series capacitor connected between the power source and the second coil; and
a shunt capacitor connected to a node between the second coil and the power source.

43. The apparatus of claim 42, wherein at least one of the series capacitor and the shunt capacitor is a variable capacitor.

44. The apparatus of claim 43, further comprising:
at least one sensor disposed to measure power distribution between the coils; and
a controller connected to adjust one or more capacitors in the power distribution network in response to measured current data from the at least one sensor.

45. The apparatus of claim 42, further comprising a match network connected between the power source and the first coil, the match network also connected between the power source and the power distribution network.

46. An apparatus for plasma processing, comprising:
a chamber having a lid with a cylindrical side portion and a flat top portion;
a first coil and a second coil disposed about the lid of the chamber, wherein the first coil is a side coil disposed around the side portion of the lid and the second coil is a top coil disposed above the flat portion of the lid;

a power source connected to the first coil; and a power distribution network connected between the second coil and the power source, the power distribution network comprising:
  a series capacitor connected between the power source and the second coil; and
  a shunt capacitor connected to a node between the second coil and the power source.

47. The apparatus of claim 46, wherein at least one of the series capacitor and the shunt capacitor is a variable capacitor.

48. The apparatus of claim 47, further comprising:
  at least one sensor disposed to measure power distribution between the coils; and
  a controller connected to adjust one or more capacitors in the power distribution network in response to measured current data from the at least one sensor.

49. The apparatus of claim 46, further comprising a match network connected between the power source and the first coil, the match network also connected between the power source and the power distribution network.

50. An apparatus for plasma processing, comprising:
  a chamber having a flat lid;
  a first coil and a second coil disposed about the flat lid of the chamber, wherein the first coil is a planar multi-turn outer coil and the second coil is a planar multi-turn inner coil;
  a power source connected to the first coil; and
  a power distribution network connected between the second coil and the power source, the power distribution network comprising:
    a series capacitor connected between the power source and the second coil; and
    a shunt capacitor connected to a node between the second coil and the power source.

51. The apparatus of claim 50, wherein at least one of the series capacitor and the shunt capacitor is a variable capacitor.

52. The apparatus of claim 51, further comprising:
  at least one sensor disposed to measure power distribution between the coils; and
  a controller connected to adjust one or more capacitors in the power distribution network in response to measured current data from the at least one sensor.

53. The apparatus of claim 50, further comprising a match network connected between the power source and the first coil, the match network also connected between the power source and the power distribution network.

54. An apparatus for plasma processing, comprising:
  a chamber having a flat lid;
  a first coil and a second coil disposed about the flat lid of the chamber, wherein the first coil is a helical multi-turn outer coil and the second coil is a helical multi-turn inner coil;
  a power source connected to the first coil; and
  a power distribution network connected between the second coil and the power source, the power distribution network comprising:
    a series capacitor connected between the power source and the second coil; and
    a shunt capacitor connected to a node between the second coil and the power source.

55. The apparatus of claim 54, wherein at least one of the series capacitor and the shunt capacitor is a variable capacitor.

56. The apparatus of claim 55, further comprising:
  at least one sensor disposed to measure power distribution between the coils; and
  a controller connected to adjust one or more capacitors in the power distribution network in response to measured current data from the at least one sensor.

57. The apparatus of claim 54, further comprising a match network connected between the power source and the first coil, the match network also connected between the power source and the power distribution network.

58. An apparatus for plasma processing, comprising:
  a chamber having a flat lid;
  a first coil and a second coil disposed about the flat lid of the chamber, wherein the first coil is a single-turn outer coil and the second coil is a single-turn inner coil;
  a power source connected to the first coil; and
  a power distribution network connected between the second coil and the power source, the power distribution network comprising:
    a series capacitor connected between the power source and the second coil; and
    a shunt capacitor connected to a node between the second coil and the power source.

59. The apparatus of claim 58, wherein at least one of the series capacitor and the shunt capacitor is a variable capacitor.

60. The apparatus of claim 59, further comprising:
  at least one sensor disposed to measure power distribution between the coils; and
  a controller connected to adjust one or more capacitors in the power distribution network in response to measured current data from the at least one sensor.

61. The apparatus of claim 58, further comprising a match network connected between the power source and the first coil, the match network also connected between the power source and the power distribution network.

* * * * *